United States Patent
Chen et al.

(10) Patent No.: US 7,563,719 B2
(45) Date of Patent: Jul. 21, 2009

(54) DUAL DAMASCENE PROCESS

(75) Inventors: Po-Zen Chen, Kaohsiung (TW);
Tzu-Chan Weng, Kaohsiung (TW);
Chien-Chung Chen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 9 days.

(21) Appl. No.: 11/724,284

(22) Filed: Mar. 15, 2007

(65) Prior Publication Data

US 2008/0227288 A1 Sep. 18, 2008

(51) Int. Cl.
*H01L 21/311* (2006.01)

(52) U.S. Cl. .................. 438/700; 438/311; 438/712; 257/E21.17; 257/E21.32; 257/E21.218; 257/E21.229; 257/E21.267; 257/E21.304; 257/E21.585

(58) Field of Classification Search ................ 438/700, 438/701, 702, 703, 761, 778, 780, FOR. 118, 438/FOR. 395, 905, 911, 933, 311, 736, 769, 438/733, 734, 712, 752, 753, 680, 692
See application file for complete search history.

(56) References Cited

U.S. PATENT DOCUMENTS

| 6,440,833 | B1 * | 8/2002 | Lee et al. .................. 438/601 |
| 7,125,806 | B2 * | 10/2006 | Harada et al. .............. 438/706 |
| 2003/0109132 | A1 * | 6/2003 | Lee ........................... 438/638 |
| 2003/0181050 | A1 * | 9/2003 | Hu et al. .................... 438/694 |
| 2004/0209469 | A1 * | 10/2004 | Harada et al. .............. 438/689 |
| 2005/0101117 | A1 * | 5/2005 | Ozawa ....................... 438/622 |
| 2007/0004933 | A1 * | 1/2007 | Wakiya et al. ............... 558/38 |
| 2008/0020581 | A1 * | 1/2008 | Liu ............................ 438/706 |
| 2008/0146036 | A1 * | 6/2008 | Lai et al. .................... 438/710 |

FOREIGN PATENT DOCUMENTS

CN 1480995 A 3/2004

* cited by examiner

*Primary Examiner*—David Nhu
(74) *Attorney, Agent, or Firm*—Birch, Stewart, Kolasch & Birch, LLP

(57) ABSTRACT

A dual damascene process. A first photoresist layer with a first opening corresponding to a trench pattern is formed on a dielectric layer. A second photoresist layer with a second opening corresponding to a via pattern smaller then the trench pattern is formed on the first photoresist layer and extends to a portion of the dielectric layer. The second photoresist layer has a material character different from the first photoresist layer. A via etching process using the second photoresist as a mask is performed to form a via hole passing through the dielectric layer. A photoresist ashing process is performed to remove the second photoresist layer. A trench etching process using the first photoresist layer as a mask is performed to form a trench in the upper portion of the dielectric layer. The via etching process, the photoresist ashing process and the trench etching process are performed as a continuous process in one chamber.

14 Claims, 4 Drawing Sheets

DUAL DAMASCENE PROCESS

TECHNICAL FIELD

The present invention relates to a method of fabricating semiconductor integrated circuit devices, and particularly to a dual damascene process incorporating two types of photoresist layers and performing a via etching step, a trench etching step and a photoresist ashing step in one chamber.

BACKGROUND

Dual-damascene interconnect features are advantageously used to provide planarized interconnect structures that afford the use of multiple interconnect layers and therefore increase levels of device integration. There is a trend in the semiconductor industry towards the use of low-dielectric constant (low-k) dielectric materials, particularly used in conjunction with copper conductive lines, to reduce the RC time delay of the conductive lines. Dual-damascene methods include either a "via-first" patterning methods in which via holes are first patterned in the insulating layer through the entire thickness of the insulating layer, and then trenches are patterned in a top portion of the insulating layer. Or, the trenches may alternatively be patterned in a top portion of the insulating layer first, followed by the patterning of the via holes through the insulating layer, called "trench-first" patterning methods. However, the two approaches need separated etching steps for forming the trench and via hole. It remains a challenge in dual damascene process to develop simplified processing with fewer processing steps, both photo and etching steps, to achieve the trench/via patterning and formation of trench and via holes.

SUMMARY OF THE INVENTION

Embodiments of the present invention include a dual damascene process using two types of photoresist layers for defining trench/via patterns, and performing via/trench etching and photoresist ashing in one chamber.

In one aspect, the present invention provides a dual damascene process. A first photoresist layer with a first opening corresponding to a trench pattern is formed on a dielectric layer. A second photoresist layer with a second opening corresponding to a via pattern smaller then the trench pattern is formed on the first photoresist layer and extends to a portion of the dielectric layer. The second photoresist layer has a material character different from the first photoresist layer. A via etching process using the second photoresist as a mask is performed to form a via hole passing through the dielectric layer. A photoresist ashing process is performed to remove the second photoresist layer. A trench etching process using the first photoresist layer as a mask is performed to form a trench in the upper portion of the dielectric layer. The via etching process, the photoresist ashing process and the trench etching process are performed as a continuous process in one chamber.

In another aspect, the present invention provides a dual damascene process. A first material layer with a first opening corresponding to a trench pattern is formed on a dielectric layer. A second material layer with a second opening corresponding to a via pattern smaller then the trench pattern is formed on the first material layer and extends to a portion of the dielectric layer. The second material layer has a material character different from the first material layer. A via etching process using the second material as a mask is performed to form a via hole passing through the dielectric layer. The second material layer is removed. A trench etching process using the first material layer as a mask is performed to form a trench in the upper portion of the dielectric layer. The via etching process, removing the second material layer, and the trench etching process are performed as a continuous process in one chamber.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
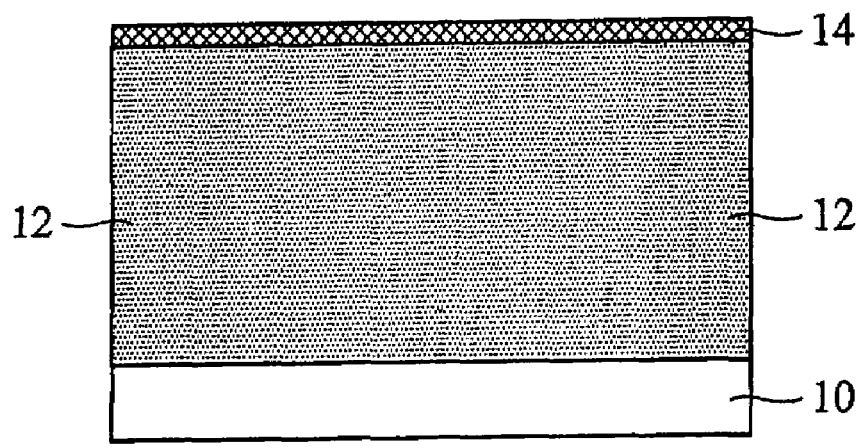
FIG. 1 to FIG. 7 are cross-sectional diagrams illustrating an exemplary embodiment of a dual damascene process performing via/trench etching and photoresist ashing in one chamber.

Embodiments of the present invention provide a novel method of forming a dual damascene structure for integrated circuits device applications. Keys to the present invention are the use of two types of photoresist layers for defining trench and via patterns, and the subsequent steps including via/trench etching and photoresist ashing performed in one chamber. This all-in-one via/trench etching process develops simplified dual damascene processing with fewer steps to save chemistry usage in processing, decrease processing time and lower costs.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1 to FIG. 7 illustrate an exemplary embodiment of a dual damascene process performing via/trench etching and photoresist ashing in one chamber.

In FIG. 1, an example of a semiconductor substrate 10 used for interconnection fabrication is provided with an inter-metal-dielectric (IMD) layer 12 patterned thereon. The semiconductor substrate 10 comprises a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. The semiconductor substrate 10 may comprise conductive regions, which are portions of conductive routs and have exposed surfaces treated by a planarization process, such as chemical mechanical polishing. Suitable materials for the conductive regions may include, but not limited to, for example copper, aluminum, copper alloy, or other mobile conductive materials. The conductive regions are omitted in the drawings for clarity and convenience. Copper interconnect level may be the first or any subsequent metal interconnect level of the semiconductor device.

The IMD layer 12 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate. The IMD layer 12 may be a single layer or a multi-layered structure. The thickness of the IMD layer 12 varies with the applied technology, for example a thickness of about 1000 angstroms to about 30000 angstroms. The IMD layer 12 may be formed of $SiO_2$, carbon-doped $SiO_2$, a comparatively low dielectric constant (k value) dielectric material with a k value less than about 4.0, or combinations thereof. A wide variety of low-k materials may be employed in accordance with embodiments of the present invention, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material.

Optionally, a capping layer 14 is formed on the IMD layer 12, which also relieves stress in the IMD layer 12. In an embodiment, the capping layer 14 comprises a dielectric layer, such as oxide, tetra-ethyl-ortho-silicate (TEOS) based oxides, nitride, oxy-nitride, silicon carbide, low-k dielectric material or other dielectric material through any of a variety of techniques, including, CVD, PECVD, PVD, and future-developed deposition procedures. In an embodiment, the capping layer 14 is an antireflective coating of either an inorganic material (SiON) or an organic material underneath a resist layer.

Figure 2:
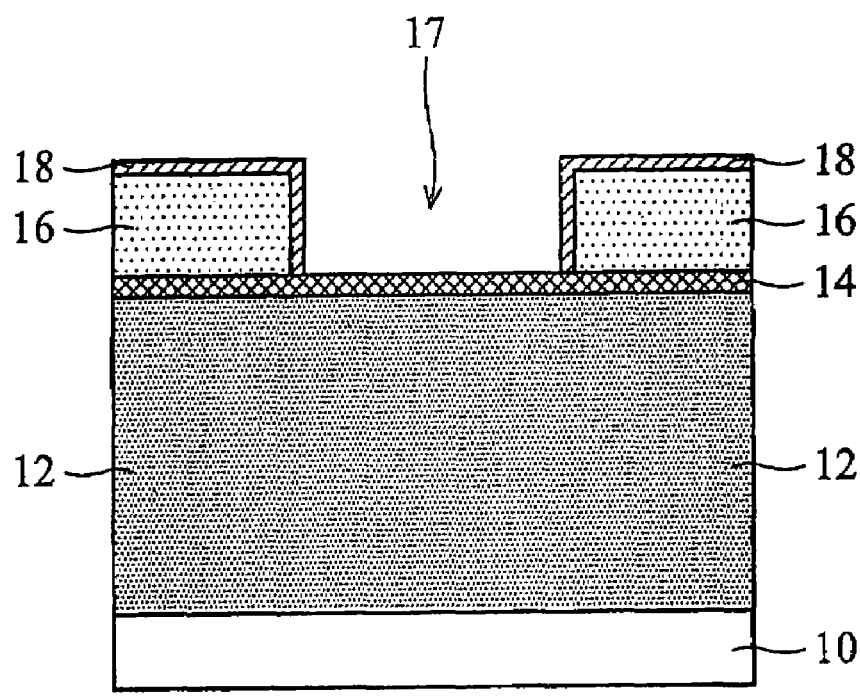

In FIG. 2, a first material layer 16 having a trench pattern is formed over the capping layer 14. The first material layer 16 comprises a photoresist layer or other photo-sensitive material. For example, the first material layer 16 may be a photo-sensitive material, 153 nm, 193 nm, 248 nm, I-line or deep UV photoresist or other common photoresists, e.g., TS, SEPR, TOK, TDUR, TS, ARX, HMD, etc. An opening 17 corresponding to a trench pattern is formed within the first material layer 16 by an etch, photolithographic (e.g., exposing and developing) or other process that is adapted to remove a portion of the first material layer 16 and expose the underlying layer which is the capping layer 14 in the illustrated embodiment. FIG. 2 shows the trench after development inspection (trench ADI). Moreover, a hardening process, e.g., heating or plasma hardening, is then performed to form a harden layer 18 on the exposed surface of the first material layer 16 in order to enhance its etch resistance and prevent ashing damage from a subsequent via etching process.

Figure 3:
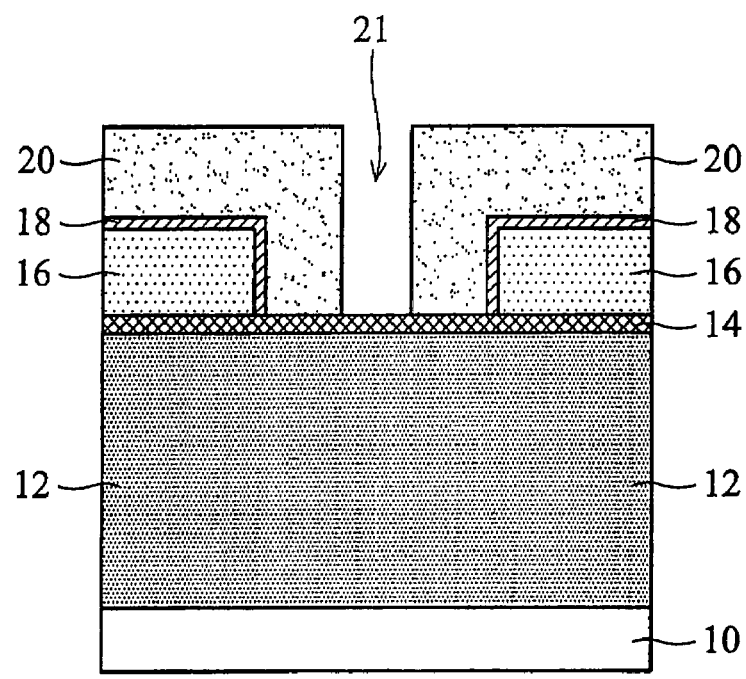

In FIG. 3, a second material layer 20 having a via pattern is formed over the first material 16 and extends to a portion of the capping layer 14 because the via pattern is smaller than the trench pattern. The second material layer 20 is formed of a different material than the first material layer 16. The second material layer 20 may be formed of a photoresist layer or other photo-sensitive material by a spin-coating method. In various exemplary embodiments, the second material layer 20 may be 153 nm, 193 nm, 248 nm, I line or DUV photoresist or other common photoresists (e.g., TS, SEPR, TOK, TUDR, TS, ARX, HMD. etc. . . . ). The second material layer 20 may be a TARC (top anti-reflective coating) or other anti-reflective coating (ARC). An opening 21, corresponding to a via pattern smaller than the trench pattern, is formed within the second material layer 20 by an etch, photolithographic (e.g., exposing and developing) or other process that is adapted to remove a portion of the second material layer 20 and expose the underlying layer which is the capping layer 14 in the illustrated embodiment. FIG. 3 shows the via after development inspection (via ADI). The second material layer 20 advantageously differs from the first material layer 16. For example, the resist process including exposing and developing steps for the second material layer 20 does not affect the exposed and developed bottom layer 16 because the material layers 16 and 20 are sensitive to different exposure sources.

Figure 4:
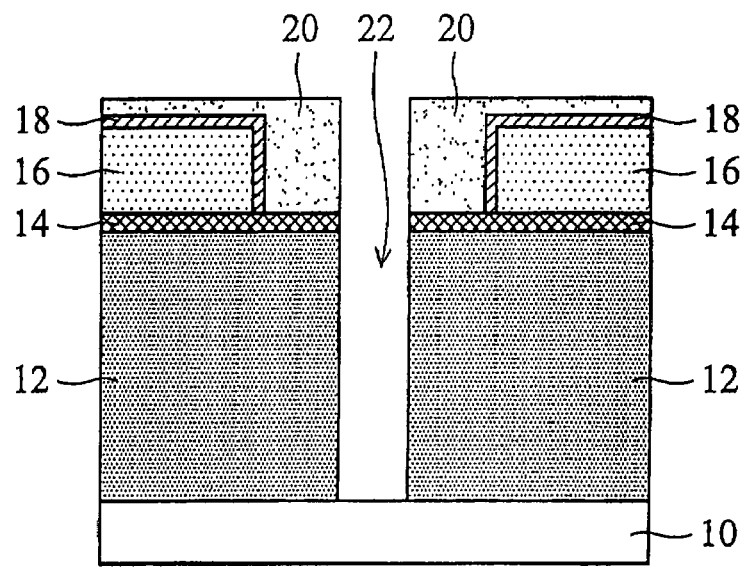
Figure 5:
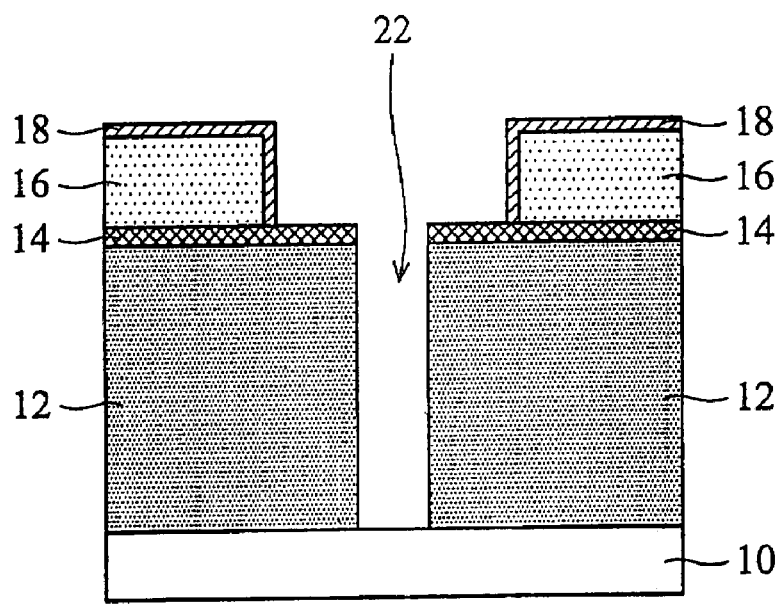

In FIG. 4, an anisotropic etch operation (e.g. plasma etching or reactive ion etching) is performed to transfer the via pattern of the second material layer 20 through the capping layer 14 and the IMD layer 12 in an etcher chamber, thereby forming a via hole 22. In FIG. 5, the remaining material layer 20 is immediately stripped away by an in-situ plasma ash/treatment in the same chamber as the via etch. The plasma ash/treatment removes the second material layer 20 and functions as a wafer clean in addition to eliminating resist poisoning. The in-situ process reduces the overall via etch and clean time. An automatic endpoint system may be used to terminate the ash/treatment when the second material layer 20 is completely removed because a signal corresponding to at least one material characteristic of the second material layer 20 may be detected by the endpoint system. After the signal corresponding to the material characteristic is detected, the ash/treatment applied to the material layers 20 and 16 simultaneously can be either automatically stopped or reduced by applying another etch process that reduces etch rates to the material layers 20 and 16, when the signal changes, drops, or otherwise inflects according to endpoint techniques that thereby indicates that all of the second material layer 20 has been removed.

The endpoint technique used to automatically terminate the etching process when the second material layer 20 is completely removed, relies upon differences between the characteristics of material layers 20 and 16. In some exemplary embodiments, a series of different photoresist materials may be used. The material layers 20 and 16 may simply be formed of different photoresist materials, i.e., photoresist materials having a characteristic that is detectable within a certain wavelength range and which provides a signal that changes or inflects when one photoresist material is completely removed, i.e., when the interface between the two different photoresist materials is reached. In other exemplary embodiments, as above, dopants may be added to provide different characteristics to the material layers. The material characteristic may comprise a CN, CO, CF or other signal in one exemplary embodiment. This characteristic can be formed by adding dopants that can be shown in a spectrum. In other exemplary embodiments, the material layers 20 and 16 may represent other different materials and signals representative of various film qualities may be similarly used to detect when the second material layer 20 is completely removed and the first material layer 16 is exposed.

Figure 6:
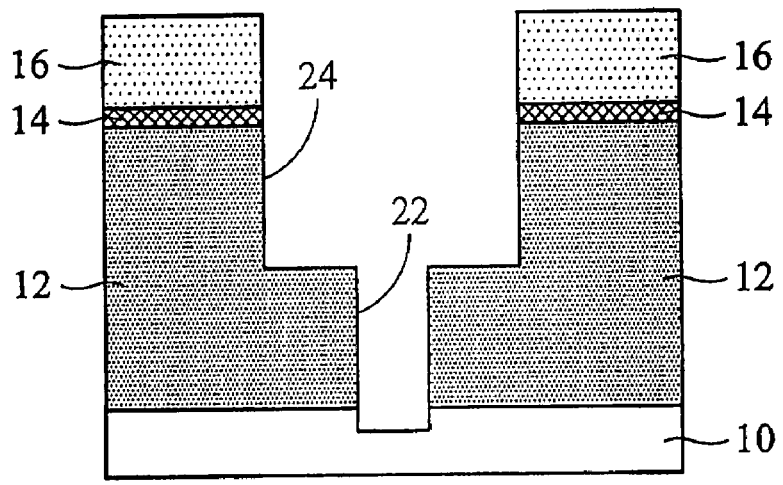
Figure 7:
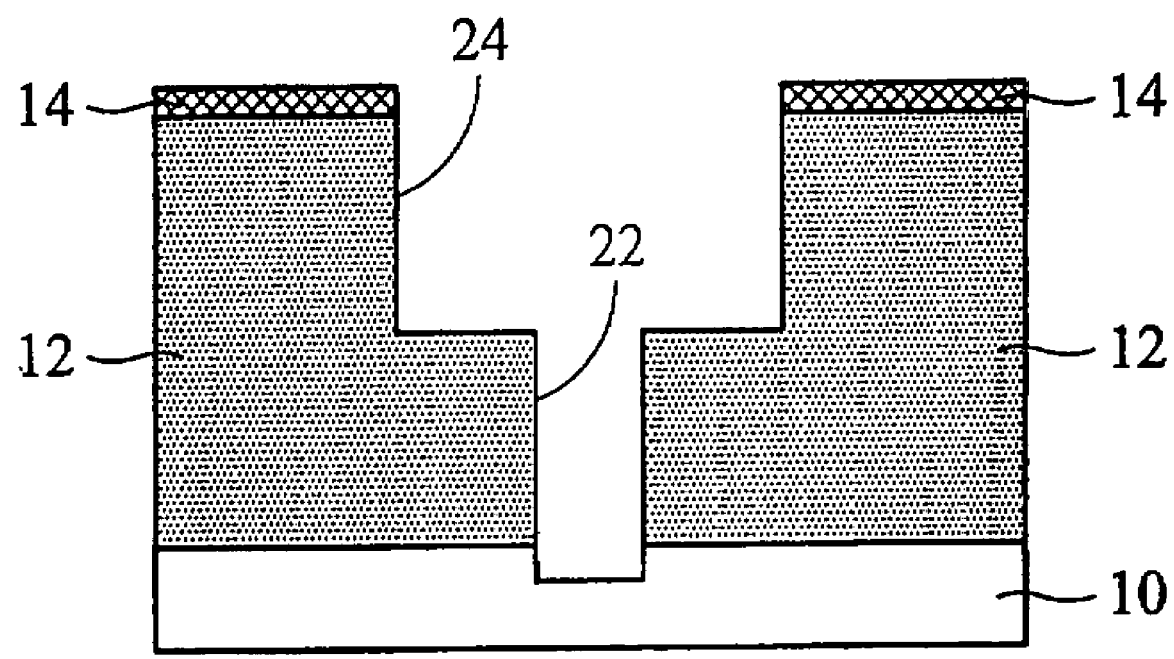

In FIG. 6, an anisotropic etch operation (e.g. plasma etching or reactive ion etching) is performed to transfer the trench pattern of the first material layer 16 through the capping layer 14 and a partial thickness of the IMD layer 12 in the same etcher chamber, thereby forming a trench 24 over the via hole 22. During the etch process through the IMD layer 12, the first material layer 16 is typically consumed and the level of the material layer on the top surface of the substrate 10 in the via hole 22 may be reduced. Finally, in FIG. 7, the remaining material layer 16 is immediately stripped away by an in-situ plasma ash/treatment in the same chamber as the via/trench etch. Therefore, the trench 24 is formed in the upper portion of the IMD layer 12, and the via hole 22 is formed in the lower portion of the IMD layer 12, completing a dual-damascene opening.

Accordingly, the inventive method has the following advantages. First, combining the via/trench etching and photoresist ashing steps as a continuous process in one chamber can reduce process steps, thus saving chemistry usage and tool operation time and lowering process costs. Second, using different materials types for developing trench and via patterns can well control the trench profile in the trench etch process through the use of etching endpoint system detecting different signals produced from different photoresist types. This also makes the clean function workable in the photoresist ashing step after the via etching process, thus keeping the trench ADI. Third, the hardening process performed on the first material layer 16 can prevent damages from the subsequent via etching and ashing processes.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A dual damascene process, comprising:
    providing a semiconductor substrate comprising a dielectric layer formed thereon;
    forming a first photoresist layer overlying said dielectric layer, wherein said first photoresist layer comprises a first opening corresponding to a trench pattern;
    performing a hardening process on said first photoresist layer to form a harden layer;
    after performing the hardening process, forming a second photoresist layer overlying said first photoresist layer and a portion of said dielectric layer, wherein said second photoresist layer comprises a second opening corresponding to a via pattern smaller than said trench pattern, said second opening is positioned over said first opening, and said second photoresist layer has a material characteristic different from that of said first photoresist layer;
    performing a via etching process using said second photoresist layer as a mask to form a via hole passing through said dielectric layer;
    performing a photoresist ashing process to remove said second photoresist layer; and
    performing a trench etching process using said first photoresist layer as a mask to form a trench in the upper portion of said dielectric layer;
    wherein, said via etching process, said photoresist ashing process and said trench etching process are performed in one chamber.

2. The dual damascene process of claim 1, further comprising performing another photoresist ashing process in said chamber to remove said first photoresist layer after performing a trench etching process.

3. The dual damascene process of claim 1, wherein said photoresist ashing process is automatically terminated by an endpoint system when said second photoresist layer is completely removed.

4. The dual damascene process of claim 3, wherein a detectable signal representative of a characteristic of said second photoresist layer changes to automatically stop said photoresist ashing process when said second photoresist layer is completely removed.

5. The dual damascene process of claim 1, wherein said dielectric layer has a dielectric constant of less than about 3.9.

6. The dual damascene process of claim 1, further comprising forming a capping layer on said dielectric layer before forming said first photoresist layer.

7. A dual damascene process, comprising:
    providing a semiconductor substrate comprising a dielectric layer formed thereon;
    forming a first material layer overlying said dielectric layer, wherein said first material layer comprises a first opening corresponding to a trench pattern, and wherein said first material layer is a photo-sensitive material;
    performing a hardening process on said first material layer to form a harden layer;
    after performing the hardening process, forming a second material layer overlying said first material layer and a portion of said dielectric layer, wherein said second material layer comprises a second opening corresponding to a via pattern smaller than said trench pattern, said second opening is positioned over said first opening, and said second material layer is different from said first material layer;
    performing a via etching process using said second material as a mask to form a via hole passing through said dielectric layer;
    removing said second material layer; and
    performing a trench etching process using said first material layer as a mask to form a trench in the upper portion of said dielectric layer;
    wherein, said via etching process, removing said second material layer, and said trench etching process are performed in one chamber.

8. The dual damascene process of claim 7, further comprising removing said first material layer in said chamber after performing a trench etching process.

9. The dual damascene process of claim 7, wherein the step of removing said second material layer is automatically terminated by an endpoint system when said second material layer is completely removed.

10. The dual damascene process of claim 9, wherein a detectable signal representative of a characteristic of said second material layer changes to automatically stop the step of removing said second material layer.

11. The dual damascene process of claim 7, wherein said dielectric layer has a dielectric constant of less than about 3.9.

12. The dual damascene process of claim 7, further comprising forming a capping layer on said dielectric layer before forming said first material layer.

13. The dual damascene process of claim 7, wherein said first material layer comprises a photoresist.

14. The dual damascene process of claim 7, wherein said second material layer comprises a photoresist.

* * * * *